(12) United States Patent
Tanaka et al.

(10) Patent No.: US 7,702,702 B2
(45) Date of Patent: Apr. 20, 2010

(54) SIGNAL PROCESSING DEVICE FOR COMPUTING PHASE DIFFERENCE BETWEEN ALTERNATING CURRENT SIGNALS

(75) Inventors: Ryohei Tanaka, Osaka (JP); Toyokazu Kitano, Osaka (JP)

(73) Assignee: Daihen Corporation, Osaka (JP)

( * ) Notice: Subject to any disclaimer, the term of this patent is extended or adjusted under 35 U.S.C. 154(b) by 965 days.

(21) Appl. No.: 11/406,885

(22) Filed: Apr. 19, 2006

(65) Prior Publication Data

US 2006/0248138 A1    Nov. 2, 2006

(30) Foreign Application Priority Data

Apr. 21, 2005   (JP) ............... 2005-123270

(51) Int. Cl.
| | |
|---|---|
| H03M 1/00 | (2006.01) |
| G06F 1/02 | (2006.01) |
| G06F 17/10 | (2006.01) |
| G01R 25/00 | (2006.01) |
| H03D 13/00 | (2006.01) |

(52) U.S. Cl. ................ 708/4; 708/276; 708/300; 324/76.77

(58) Field of Classification Search ............ 708/4, 708/276, 300; 375/235, 330, 332; 324/76.52–76.82
See application file for complete search history.

(56) References Cited

U.S. PATENT DOCUMENTS

| | | | | |
|---|---|---|---|---|
| 5,165,051 A | * | 11/1992 | Kumar | ............ 324/76.47 |
| 5,440,587 A | * | 8/1995 | Ishikawa et al. | ............ 375/332 |
| 5,828,707 A | * | 10/1998 | Urabe et al. | ............ 375/330 |
| 5,844,408 A | * | 12/1998 | Yoshimura et al. | ........ 324/76.52 |
| 5,949,821 A | * | 9/1999 | Emami et al. | ............ 375/235 |
| 6,657,394 B2 | | 12/2003 | Nasman | |

FOREIGN PATENT DOCUMENTS

JP    2002-329599    11/2002

\* cited by examiner

*Primary Examiner*—Chat C. Do
*Assistant Examiner*—Matthew Sandifer
(74) *Attorney, Agent, or Firm*—Hamre, Schumann, Mueller & Larson, P.C.

(57) ABSTRACT

A signal processing device includes a converting unit, a filtering unit, a differential computing unit, and a phase difference computing unit. The converting unit samples two alternating signals with a predetermined period and converts the sampled level values into digital alternating signal data. The filtering unit filters the two digital alternating signal data generated by the converting unit so as to abstract digital alternating signal data having a predetermined frequency, and the filtering unit comprises an adaptive digital filter. The differential computing unit computes differentials of the digital alternating signal data generated by the filtering unit. The phase difference computing unit computes phase difference using the two digital alternating signal data generated by the filtering unit, and the two digital alternating signal data generated by the differential computing unit.

2 Claims, 5 Drawing Sheets

SIGNAL PROCESSING DEVICE FOR COMPUTING PHASE DIFFERENCE BETWEEN ALTERNATING CURRENT SIGNALS

BACKGROUND OF THE INVENTION

1. Field of the Invention

The present invention relates to a signal processing device which serves to compute a phase difference between two alternating signals by a predetermined digital signal processing.

2. Description of the Related Art

U.S. Pat. No. 6,657,394 discloses an example of a signal processing device which serves to compute a phase difference between two alternating signals using digital signal processing technology. This kind of signal processing devices generally performs calculation based on the relations described below.

Assume that two alternating signals are expressed as $V(\theta)=\sin(\theta)$ and $I(\theta)=\sin(\theta-\phi)$, where $\phi$ is the phase difference between the two alternating signals. Then, $\sin(\phi)$ and $\cos(\phi)$, which are obviously functions of $\phi$, are derived from Formulae 7 and 8 shown below:

$$\cos(\phi) = \cos(\theta)\cos(\theta-\phi) + \sin(\theta)\sin(\theta-\phi) \quad (7)$$
$$= V'(\theta)I'(\theta) + V(\theta)I(\theta)$$

$$\sin(\phi) = \sin(\theta)\cos(\theta-\phi) - \cos(\theta)\sin(\theta-\phi) \quad (8)$$
$$= V(\theta)I'(\theta) - V'(\theta)I(\theta)$$

where $V'(\theta)$ and $I'(\theta)$ are derivatives of $V(\theta)$ and $I(\theta)$, respectively.

Conventional signal processing devices to perform such kind of computation generally incorporate a computing circuit shown in FIG. 7. This computing circuit includes an oscillator 41, multipliers 42a, 42b, 42c, 42d, and digital low pass filters 43a, 43b, 43c, 43d. The oscillator 41 serves to generate two reference waves $\sin(\theta)$ and $\cos(\theta)$. The multipliers 42a-42d serve to multiply either $\sin(\theta)$ or $\cos(\theta)$, which is a reference wave produced by the oscillator 41, and either $V\sin(\theta)$ or $I\sin(\theta-\phi)$, which is an input alternating signal, together. The digital low pass filters 43a-43d serve to eliminate high frequency components.

Each of the multipliers 42a-42d, more specifically, outputs the product of one of the combinations of the alternating voltage signals and the reference waves in the following way. The multiplier 42a multiplies the alternating voltage signal V $\sin(\theta)$ by the reference wave $\sin(\theta)$, and then outputs the obtained product V $\sin(\theta)\sin(\theta)$ to the digital low pass filter 43a. The multiplier 42b multiplies the alternating voltage signal V $\sin(\theta)$ by the reference wave $\cos(\theta)$, and then outputs the obtained product V $\sin(\theta)\cos(\theta)$ to the digital low pass filter 43b. The multiplier 42c multiplies the alternating voltage signal I $\sin(\theta-\phi)$ by the reference wave $\cos(\theta)$, and then outputs the obtained product I $\sin(\theta-\phi)\cos(\theta)$ to the digital low pass filter 43c. The multiplier 42d multiplies the alternating voltage signal I $\sin(\theta-\phi)$ by the reference wave $\sin(\theta)$, and then outputs the obtained product I $\sin(\theta-\phi)\sin(\theta)$ to the digital low pass filter 43d.

In this way, four products are produced in the computing circuit. These products are utilized by latter circuits to compute $\sin(\phi)$ and $\cos(\phi)$, to compute $\tan^{-1}(\phi)$ therefrom, and finally to obtain phase difference $\phi$.

At actual use of this kind of computing circuits, in general, the frequencies does not accord perfectly between an alternating signal V $\sin(\theta)$ or I $\sin(\theta-\phi)$, which is sent from outside, and a reference wave $\sin(\theta)$ or $\cos(\theta)$, which is generated inside the computing circuit. Assuming $\omega$ be an angular velocity whereby $\theta=\omega t$ holds, and $\Delta\omega$ be a minute difference between the frequencies of them, the reference waves are now expressed by $\sin(\omega t+\Delta\omega t)$ and $\cos(\omega t+\Delta\omega t)$.

Taking the difference $\Delta\omega$ between the frequencies into consideration, Product-to-Sum Identities of trigonometric functions transforms each of the products calculated by the multipliers 42a, 42b, 42c, and 42d into the following forms, respectively.

$$V\sin(\omega t)\sin(\omega t + \Delta\omega t) = \left(\frac{V}{2}\right)[\sin(2\omega t + \Delta\omega t) + \cos(\Delta\omega t)]$$

$$V\sin(\omega t)\cos(\omega t + \Delta\omega t) = \left(\frac{V}{2}\right)[\sin(2\omega t + \Delta\omega t) + \sin(\Delta\omega t)]$$

$$I\sin(\omega t - \phi)\cos(\omega t + \Delta\omega t) = \left(\frac{I}{2}\right)[\sin(2\omega t + \Delta\omega t - \phi) + \sin(\Delta\omega t + \phi)]$$

$$I\sin(\omega t - \phi)\sin(\omega t + \Delta\omega t) = \left(\frac{I}{2}\right)[\sin(2\omega t + \Delta\omega t - \phi) + \cos(\Delta\omega t + \phi)]$$

Through the transformation above, it is obvious that each of the four products contains a second harmonic component $\sin(2\omega t)$ to the reference waves. Each of the digital low pass filters 43a, 43b, 43c, and 43d is provided at the downstream from the multipliers 42a, 42b, 42c, and 42d, respectively, to eliminate second harmonic components. Thus, each of the output terminals OUT1-OUT4 outputs a signal without a second harmonic component to the reference waves.

The above-described signal processing device for computation of phase difference has two disadvantages. The first is instability of computed results of phase difference $\phi$. The computed results at the output terminals OUT1-OUT4 are very sensitive to a minute difference between the frequency of the reference wave generated by oscillator 41 and the frequency of the alternating signal input from outside. This fact causes the phase difference $\phi$, obtained by Formulae 7 and 8, to be unstable. The second is slow computing speed. The above-described signal processing device requires the digital low pass filters 43a-43d provided at the downstream from the multipliers 42a-42d in order to eliminate second harmonic components to the reference waves. These digital low pass filters 43a-43d, however, demand a lot of time to execute filtering operation.

SUMMARY OF THE INVENTION

The present invention has been proposed under the circumstances described above. Accordingly, it is an object of the present invention to provide a signal processing device which is able to perform computation of phase difference between two alternating signals with high speed and high precision.

The present invention takes the following measures to achieve the object above.

The present invention provides a signal processing device which computes phase difference between two analog alternating signals through imposing the two analog alternating signals under a predetermined digital signal processing, the signal processing device comprising: a converting unit sampling the two alternating signals with a predetermined period and converting the sampled level values into digital alternating signal data; a filtering unit filtering the two digital alternating signal data generated by the converting unit so as to abstract digital alternating signal data x[k] and y[k], respectively, both having a predetermined frequency, the filtering unit comprising an adaptive digital filter; a differential computing unit computing two digital alternating signal data x'[k] and y'[k] which are differentials of the digital alternating signal data generated by the filtering unit based on Formulae 1-4 below; and a phase difference computing unit computing phase difference φ between the two digital alternating signal data x[k] and y[k] based on Formulae 5 and 6 below using the two digital alternating signal data x[k], y[k] generated by the filtering unit, and the two digital alternating signal data x'[k], y'[k] generated by the differential computing unit.

$$x[k] = A_1 \sin\omega k \quad (1)$$

$$y[k] = A_2 \sin(\omega k - \phi). \quad (2)$$

$$x'[k] = \frac{1}{2\sin\omega}\{x[k+1] - x[k-1]\} \quad (3)$$

$$y'[k] = \frac{1}{2\sin\omega}\{y[k+1] - y[k-1]\} \quad (4)$$

where $A_1$ and $A_2$ are the amplitude of each of two alternating signals, ω is the angular frequency, k is one position on the time axis of the sampled data, k+1 is the position one step backward from the position k on the time axis, and k−1 is the position one step forward from the position k on the time axis.

$$\cos\phi = \frac{1}{A_1 A_2}\{x[k]y[k] + x'[k]y'[k]\} \quad (5)$$

$$\sin\phi = \frac{1}{A_1 A_2}\{x[k]y'[k] - x'[k]y[k]\} \quad (6)$$

With this arrangement, the phase difference between two alternating signals received by the phase difference computing unit as inputs are computed precisely using the two digital alternating signal data x[k], y[k] generated by the filtering unit, and the two digital alternating signal data x'[k], y'[k] generated by the differential computing unit. Therefore, it is possible to improve computing precision comparing to conventional configuration including an oscillator to generate the reference wave for computing of phase difference. Further, it is also possible to improve computing speed because digital low pass filters to eliminate harmonic components are needless. Further, removing an oscillator and digital low pass filters, the circuit configuration can be simple.

Preferably, the signal processing device according the present invention further comprises an amplifying unit amplifying the two alternating signals with a predetermined gain prior to conversion of the two alternating signals by the converting unit.

Other features and advantages of the present invention will become apparent from the detailed description given below with reference to the accompanying drawings.

DETAILED DESCRIPTION OF THE PREFERRED EMBODIMENT

A preferred embodiment of the present invention will be described below with reference to the accompanying drawings.

Figure 1:
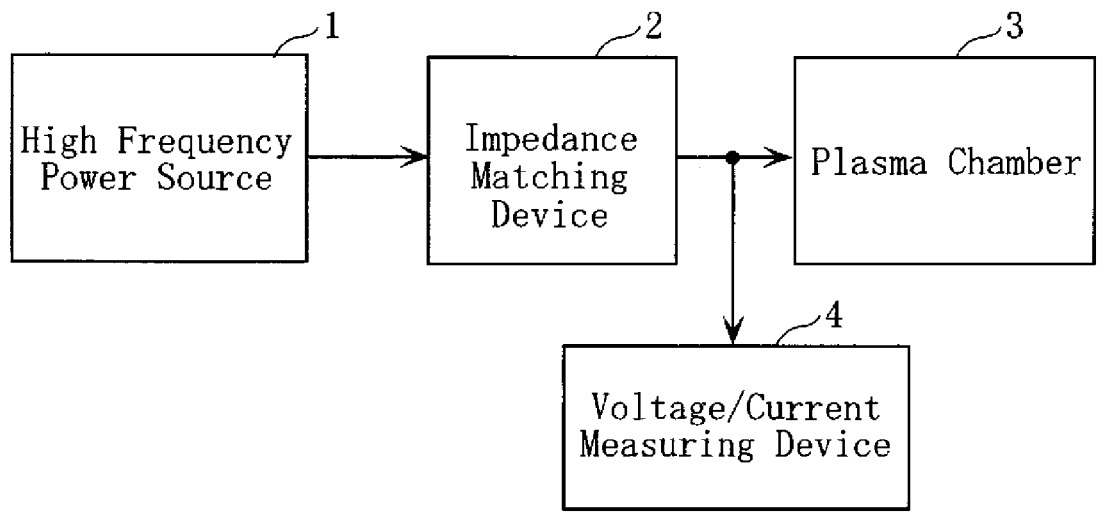
FIG. 1 is a diagram showing configuration of a high frequency power supply system which incorporates a signal processing device according to the present invention.

FIG. 1 depicts a high frequency power supply system incorporating a signal processing device according to the present invention. The high frequency power supply system serves to supply high frequency power to a material to be processed, such as semiconductor wafer and liquid crystal substrate, during a process such as plasma etching.

The high frequency power supply system includes a high frequency power source 1, an impedance matching device 2, a plasma chamber 3 which serves as a load, and a voltage/current measuring device 4. The voltage/current measuring device 4, which is provided between the impedance matching device 2 and the plasma chamber 3, serves to measure high frequency voltage and current signals at an input terminal of the plasma chamber 3.

Figure 2:
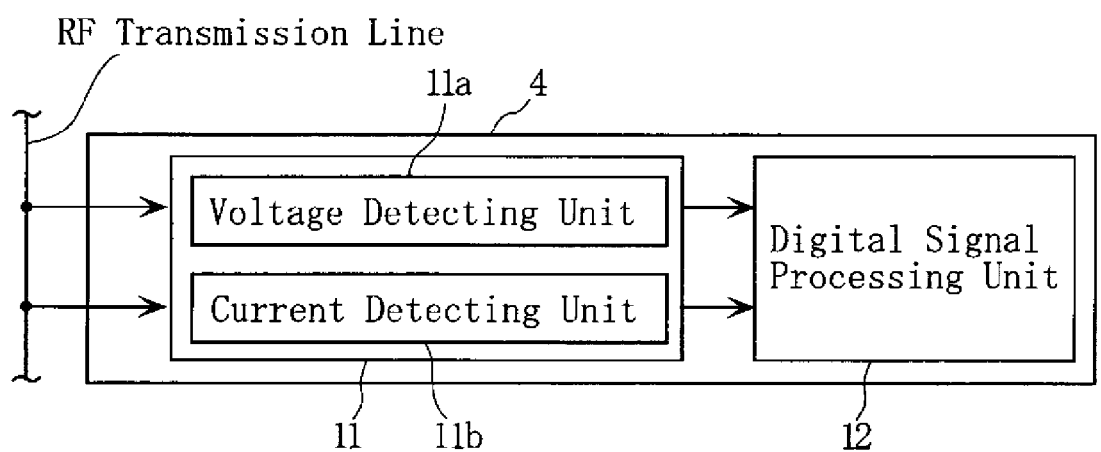
FIG. 2 is a block diagram showing fundamental configuration of a voltage/current measuring device.

FIG. 2 is a block diagram showing inner structure of the voltage/current measuring device 4. The voltage/current measuring device 4 includes an analog signal processing unit 11 and a digital signal processing unit 12. The analog signal processing unit 11 includes a voltage detecting unit 11a, which detects an analog alternating voltage signal, and a current detecting unit 11b, which detects an analog alternating current signal. The analog signals consisting of the alternating voltage signal and the alternating current signal, which are sent from the analog signal processing unit 11, are converted into digital signals by the digital signal processing unit 12. Subsequently, the digital signal processing unit 12 also computes an effective voltage Vrms of the alternating voltage signal, an effective current Irms of the alternating current signal, and a phase difference φ between the alternating voltage signal and the alternating current signal.

Figure 3:
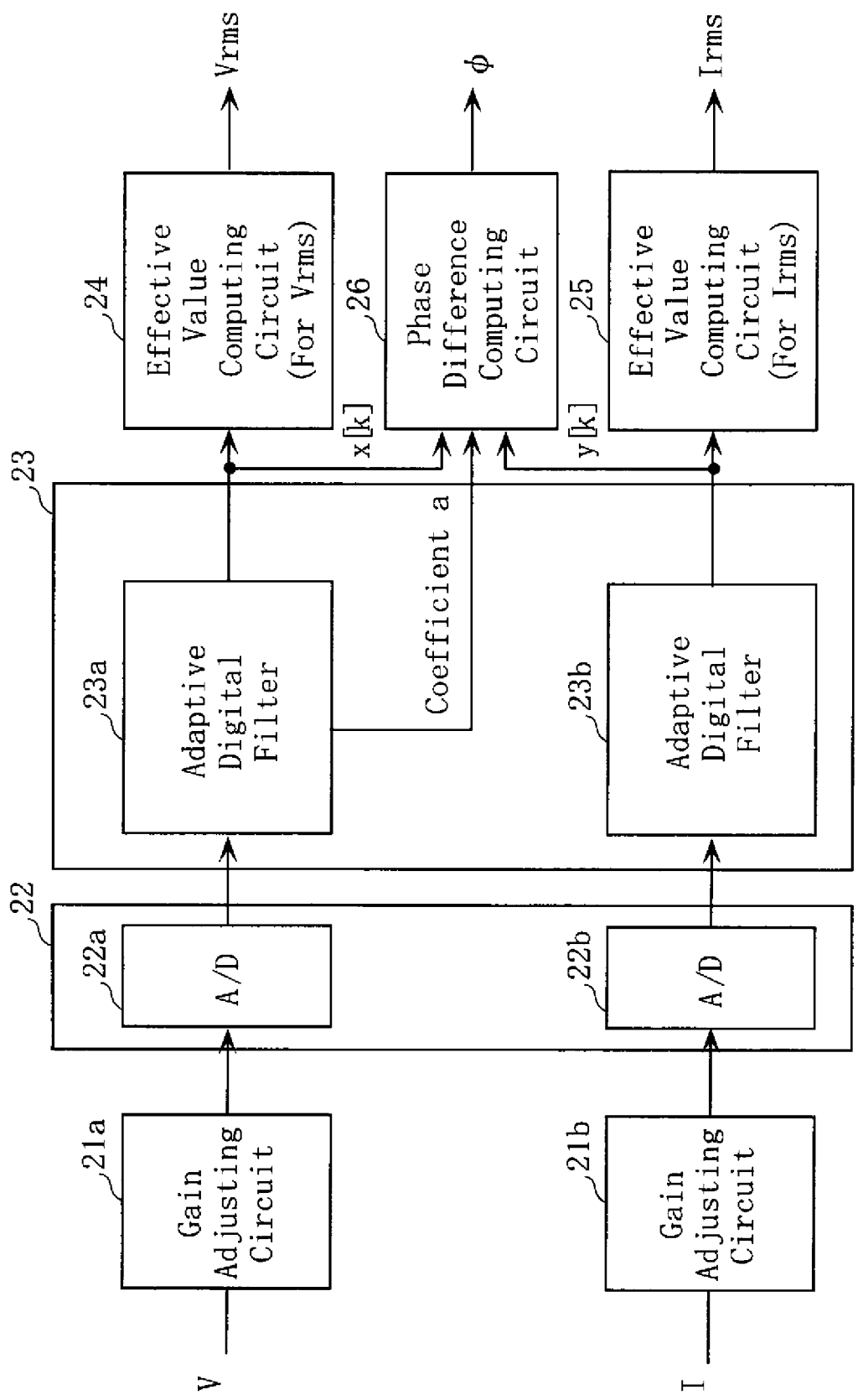
FIG. 3 is a block diagram showing fundamental configuration of a digital signal processing unit in the voltage/current measuring device.

FIG. 3 is a block diagram showing detailed inner structure of the digital signal processing unit 12. The digital signal processing unit 12 includes gain adjusting circuits 21a, 21b, an A/D converting unit 22, a digital filtering unit 23, effective value computing circuits 24, 25, and a phase difference computing circuit 26.

The gain adjusting circuits 21a, 21b serve to inhibit deterioration of computing precision. When the input level is small, the digital processing generally faces deterioration of computing precision. Each of the gain adjusting circuits 21a and 21b amplifies the alternating voltage signal V, which is detected at the voltage detecting unit 11a of the analog signal processing unit 11, and the alternating current signal I, which is detected at the current detecting unit 11b of the analog signal processing unit 11, respectively, with a predetermined gain so as to inhibit such deterioration. The gain adjusting circuits 21a, 21b may be incorporated in the analog signal processing unit 11 instead of the digital signal processing unit 12.

The A/D converting unit 22 includes an A/D converting circuit for voltage 22a and an A/D converting circuit for current 22b, each of which converts the analog signal from the gain adjusting circuit 21a or 21b, respectively, into a digital signal.

The digital filtering unit 23 serves to abstract an alternating signal having a desired frequency from the digital alternating signal generated from the A/D converting unit 22. The "desired frequency" above means a certain frequency of wave output from the high frequency power source 1 and may be e.g. 13.56 Hz, which the high frequency power supply system employs. The digital filtering unit 23 includes adaptive digital filters 23a and 23b, each of which abstracts an alternating voltage signal or an alternating current signal, respectively. The one adaptive digital filter 23a outputs alternating voltage signal data as well as a cosine signal data. The other adaptive digital filter 23b outputs alternating current signal data.

The one effective value computing circuits 24 computes effective voltage Vrms of the alternating voltage signal, whereas the other effective value computing circuits 25 computes effective current Irms of the alternating current signal.

The phase difference computing circuit 26 serves to compute phase difference $\phi$ between the alternating voltage signal and the alternating current signal using the alternating voltage signal data, alternating current signal data, and the coefficient signal data.

Figure 4:
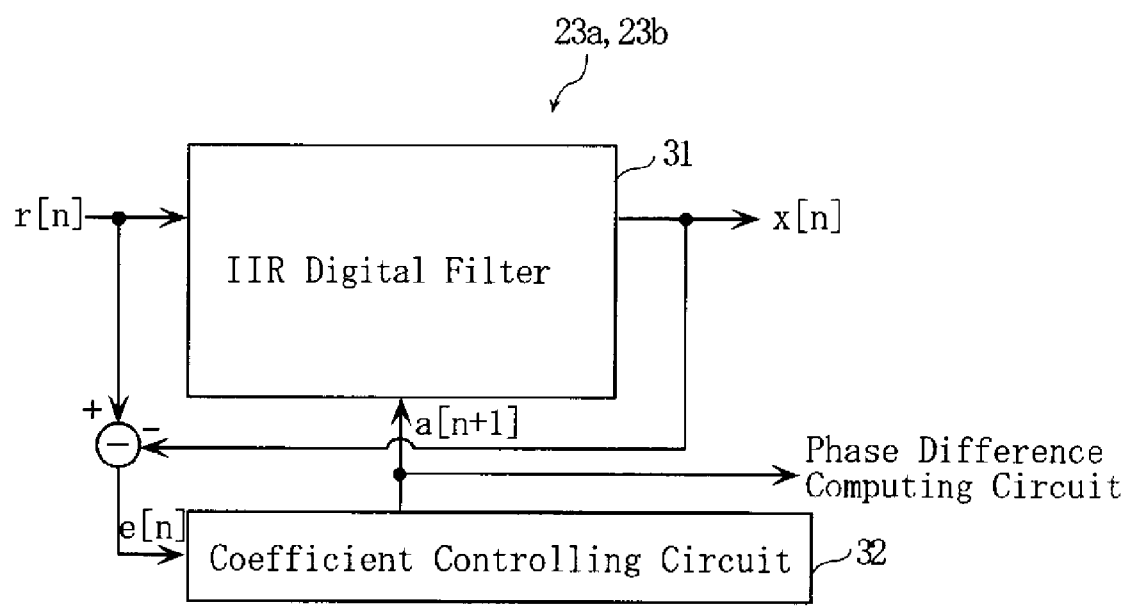
FIG. 4 is a diagram showing an example of configuration of a digital filter.

FIG. 4 shows inner structure of an adaptive digital filter 23a or 23b described above. The adaptive digital filters 23a, 23b allow its resonance frequency $f_0$ set to an arbitrary frequency, and are utilized to eliminate components whose frequency is higher than a predetermined cut-off frequency.

Each of the adaptive digital filters 23a and 23b has a digital filter 31 and a coefficient controlling circuit 32. The digital filter 31 employs an IIR (infinite impulse response) low pass filter. The coefficient controlling circuit 32 controls the coefficient "a", which determines the central frequency of the pass band of the digital filter 31. The digital filter 31 receives digital data (sampled data) r[n] as its input. Every time such data are input, the coefficient controlling circuit 32 computes the coefficient a[n+1] which minimizes the error e[n]=r[n]−x[n] between the level r[n] of that digital data and the level x[n] of digital data output from the digital filter. This computed result is set to the digital filter 31 when the next digital data r[n+1] are input. The series of processing described above allows the digital filter 31 to filter the input signal to remain a signal having a specific single frequency $f_o$ only. The coefficient a=2r cos($\omega$) is output to the phase difference computing circuit 26 as coefficient signal data, where r is a radius expressed in polar coordinates.

Figure 5:
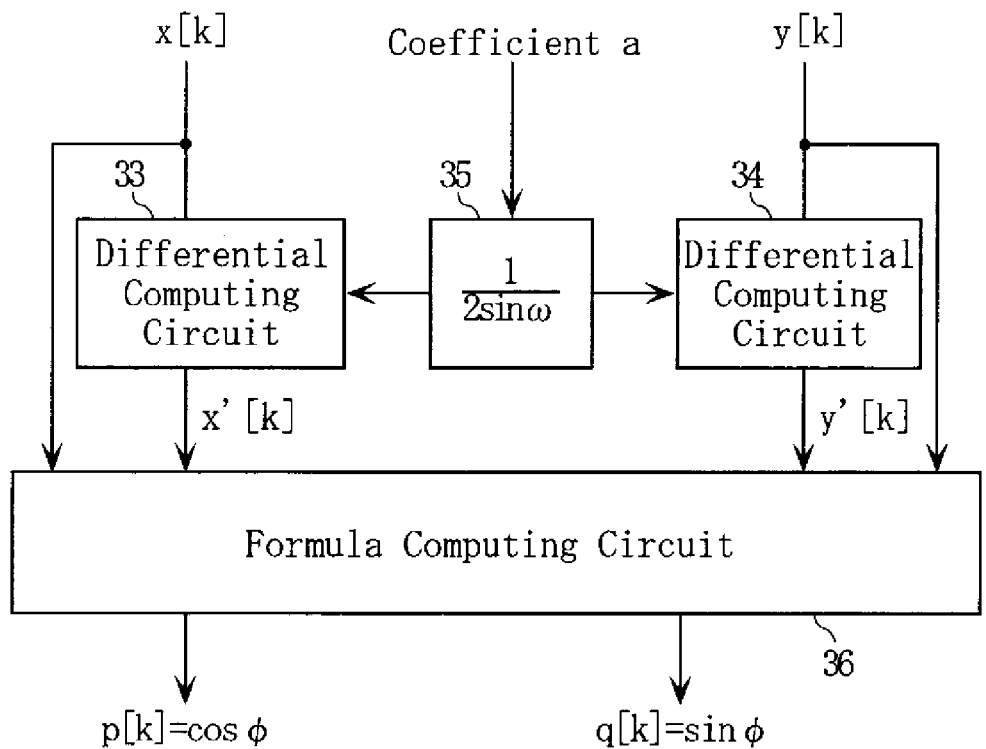
FIG. 5 is a block diagram of a phase difference computing circuit.

FIG. 5 is a block diagram showing inner structure of the phase difference computing circuit 26. The phase difference computing circuit 26 includes two differential computing circuits 33, 34, a calculating circuit 35, and a formula computing circuit 36.

The one differential computing circuit 33 differentiates alternating voltage signal data x[k] to output alternating voltage signal data x'[k]. The other differential computing circuit 34 differentiates alternating voltage signal data y[k] to output alternating voltage signal data y'[k]. The calculating circuit calculates 1/[2 sin($\omega$)] based on the coefficient signal data "a" as its input, and output the result to both of the differential computing circuits 33, 34. The formula computing circuit 36 execute calculation using the alternating voltage signal data x'[k] and the alternating current signal data y'[k] based on Formulae 13 and 14 which will be described below.

Next, operation of the phase difference computing circuit 26 shown in FIG. 5 will be described. The alternating voltage signal data x[k] and the alternating current signal data y[k], which are received by a phase difference computing circuit 26 as inputs, are expressed as Formulae 9 and 10, $$x[k] = A_1 \sin \omega k \tag{9}$$

$$y[k] = A_2 \sin(\omega k - \phi) \tag{10}$$

where $A_1$ is the amplitude of the alternating voltage signal, $A_2$ is the amplitude of the alternating current signal, $\omega$ is the angular frequency, and k is the position on the time axis of the data sampled by the A/D converting unit 22.

Figure 6:
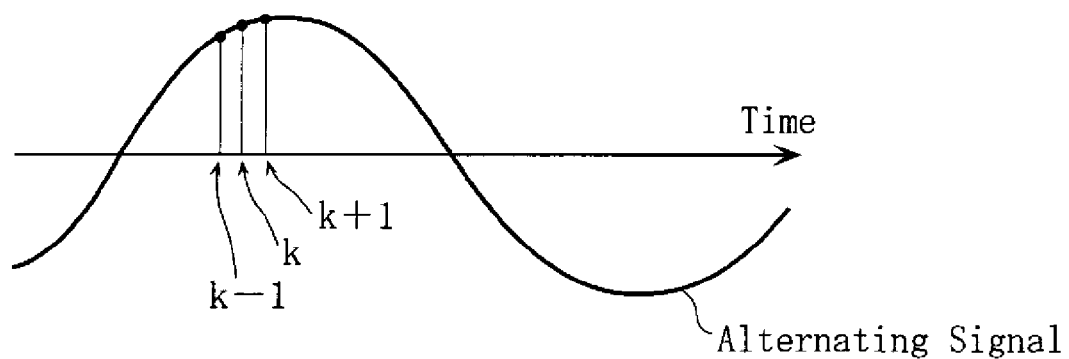
FIG. 6 is a diagram describing positions of sampled data on the time axis.
Figure 7:
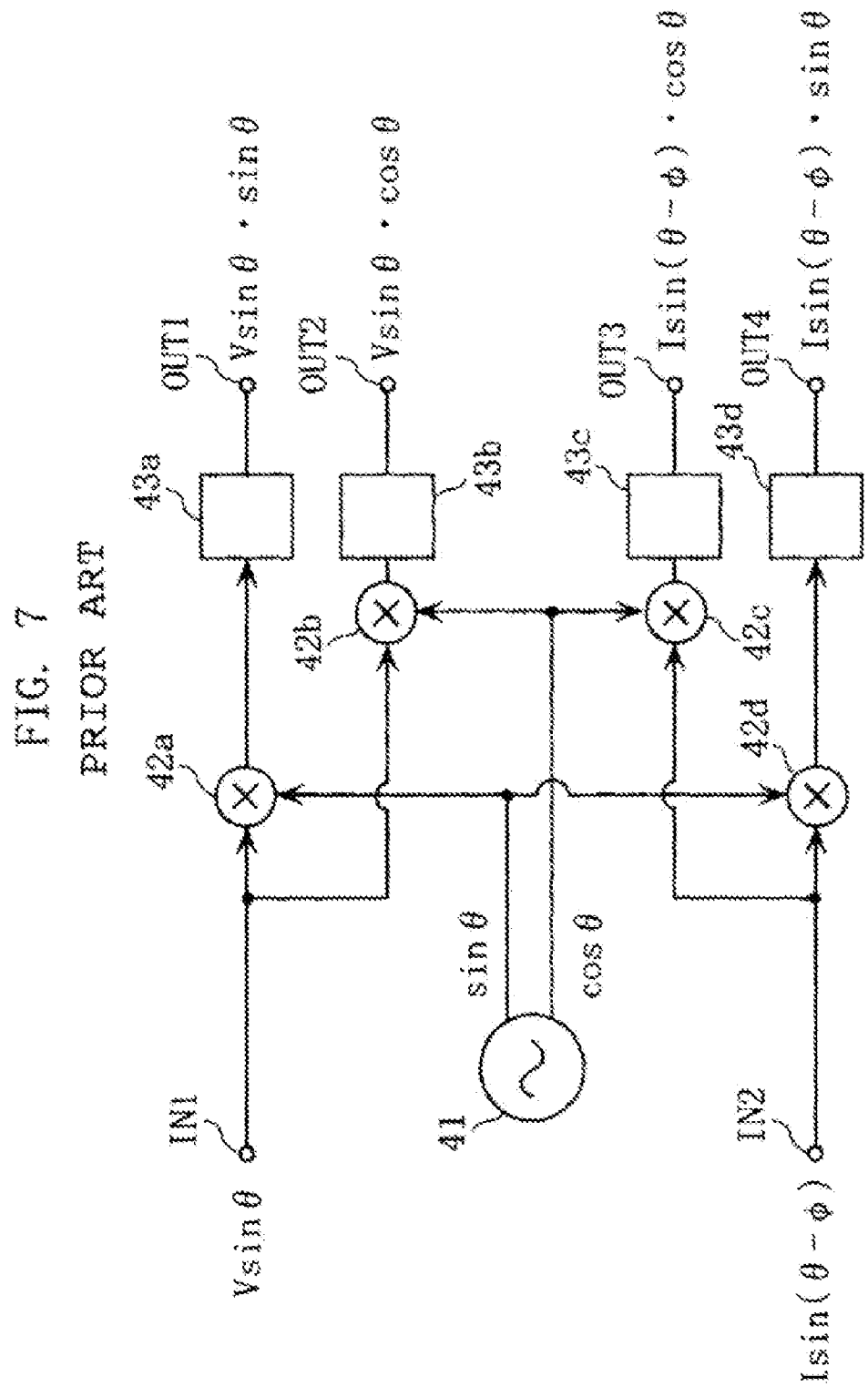
FIG. 7 is a diagram showing configuration of a conventional phase difference detecting device.

Each of the differential computing circuits 33, 34 computes the orthogonal component x'[k], y'[k] of the alternating signal data from the alternating voltage signal data x[k], the alternating current signal data y[k], based on Formulae 11, 12, respectively.

$$x'[k] = \frac{1}{2\sin\omega}\{x[k+1] - x[k-1]\} \tag{11}$$

$$y'[k] = \frac{1}{2\sin\omega}\{y[k+1] - y[k-1]\} \tag{12}$$

where, as shown in FIG. 6, "k+1" is the position of the data sampled by the A/D converting unit 22 on the time axis, and the position is one step backward from the position k on the time axis.

The calculating circuit 35 computes cos($\omega$)=a/2r, thereby sin($\omega$)=$\sqrt{[1-\cos^2(\omega)]}$, and finally 1/[2 sin($\omega$)], which is sent to the both of the differential computing circuits 33, 34.

The formula computing circuit 36 receives the orthogonal components x'[k], y'[k] of the corresponding alternating signals as inputs, and then computes phase differential data p[k], q[k], each of which means cos($\phi$), sin($\phi$), respectively, based on Formulae 13, 14. The formula computing circuit 36 may be compute tan($\phi$) to obtain phase difference $\phi$.

$$p[x] = \cos\phi = \frac{1}{A_1 A_2}\{x[k]y[k] + x'[k]y'[k]\} \tag{13}$$

$$q[x] = \sin\phi = \frac{1}{A_1 A_2}\{x[k]y'[k] - x'[k]y[k]\} \tag{14}$$

The digital and discrete processing described so far corresponds to analog operation which will be described below. Assume that two trigonometric functions shown in Formulae 15, 16 are given as input signals. The purpose of the operation is to obtain cos($\phi$) and sin($\phi$).

$$x(\theta) = A_1 \sin \theta \tag{15}$$

$$y(\theta) = A_2 \sin(\theta - \phi) \tag{16}$$

The differentials x'($\theta$), y'($\theta$) of x($\theta$), y($\theta$) are obtained by Formulae 17, 18, respectively.

$$x'(\theta) = \frac{dx(\theta)}{d\theta} = A_1 \cos\theta \tag{17}$$

$$y'(\theta) = \frac{dy(\theta)}{d\theta} = A_2 \cos(\theta - \phi) \tag{18}$$

Formulae 19, 20 below express sin($\phi$), cos($\phi$), respectively, where $\alpha=\theta$, $\beta=\theta-\phi$.

$$\sin(\phi) = \sin(\theta)\cos(\theta - \phi) - \cos(\theta)\sin(\theta - \phi) \quad (19)$$

$$\cos(\phi) = \cos(\theta)\cos(\theta - \phi) + \sin(\theta)\sin(\theta - \phi) \quad (20)$$

Due to Formulae 15-18, Formulae 19, 20 are transformed into Formulae 21, 22, by which sin(θ), cos(θ) are obtained.

$$\sin\phi = \frac{x(\theta)}{A_1} \times \frac{y'(\theta)}{A_2} - \frac{x'(\theta)}{A_1} \times \frac{y(\theta)}{A_2} \quad (21)$$
$$= \frac{1}{A_1 A_2}\{x(\theta)y'(\theta) - x'(\theta)y(\theta)\}$$

$$\cos\phi = \frac{x'(\theta)}{A_1} \times \frac{y'(\theta)}{A_2} + \frac{x(\theta)}{A_1} \times \frac{y(\theta)}{A_2} \quad (22)$$
$$= \frac{1}{A_1 A_2}\{x'(\theta)y'(\theta) + x(\theta)y(\theta)\}$$

By executing the above-described digital computation, the phase difference computing circuit 26 requires neither a reference wave generator to generate high frequency components nor a digital low pass filter which demands a lot of time for operation. Therefore, the phase difference computing circuit 26 can achieve high precision and high computing speed with more simple circuit structure, not like the case employing conventional structure which contains a reference wave generator inside.

As described above, the phase difference computing circuit 26 is incorporated in the voltage/current measuring device 4. Hereunder, description will be made with regard to operation of the entirety of voltage/current measuring device 4.

The voltage detecting unit 11a and the current detecting unit 11b of the analog signal processing unit 11 detect the alternate voltage signal and the alternate current signal, respectively, of the high frequency power at an input terminal of the plasma chamber 3. Subsequently, the detected alternating signals are subjected to a predetermined analog signal processing (such as filtering operation to eliminate undesired noise), and then sent to the digital signal processing unit 12. In the digital signal processing unit 12, the gain adjusting circuits 21a, 21b adjust their level. Next, the A/D converting circuit for voltage 22a and the A/D converting circuit for current 22b convert analog voltage and current signals into digital voltage and current signals (sampled data), respectively. Then, the adaptive digital filters 23a, 23b abstract a voltage signal and a current signal, respectively, which have a desired frequency (In this example, 13.56 MHz). The abstracted signals are sent to effective value computing circuits 24, 25, and the phase difference computing circuit 26.

Finally, the effective value computing circuit 24 produces digital data representing the effective voltage Vrms of the alternating voltage signal V with 13.56 MHz of frequency through digital signal processing described above, and then output the produced digital data to outside. Similarly, the effective value computing circuit 25 produces digital data meaning the effective current Irms of the alternating current signal I with 13.56 MHz of frequency through digital signal processing described above, and then output the produced digital data to outside. Further, the phase difference computing circuit 26 computes the phase difference φ, produces digital data meaning the phase difference φ, and then output the produced digital data to outside.

The invention claimed is:

1. A signal processing device which computes phase difference between two analog alternating signals through imposing the two analog alternating signals under a predetermined digital signal processing, the signal processing device comprising:
    a converting unit sampling the two alternating signals with a predetermined period and converting the sampled level values into digital alternating signal data;
    a filtering unit filtering the two digital alternating signal data generated by the converting unit so as to abstract digital alternating signal data x[k] and y[k], respectively, both having a predetermined frequency, the filtering unit comprising an adaptive digital filter;
    a differential computing unit computing two digital alternating signal data x'[k] and y'[k] which are differentials of the digital alternating signal data generated by the filtering unit based on Formulae 1-4 below; and
    a phase difference computing unit computing phase difference φ between the two digital alternating signal data x[k] and y[k] based on Formulae 5 and 6 below using the two digital alternating signal data x[k], y[k] generated by the filtering unit, and the two digital alternating signal data x'[k], y'[k] generated by the differential computing unit;

$$x[k] = A_1 \sin \omega k \quad (1)$$

$$y[k] = A_2 \sin(\omega k - \phi) \quad (2)$$

$$x'[k] = \frac{1}{2\sin\omega}\{x[k+1] - x[k-1]\} \quad (3)$$

$$y'[k] = \frac{1}{2\sin\omega}\{y[k+1] - y[k-1]\} \quad (4)$$

$$\cos\phi = \frac{1}{A_1 A_2}\{x[k]y[k] + x'[k]y'[k]\} \quad (5)$$

$$\sin\phi = \frac{1}{A_1 A_2}\{x[k]y'[k] + x'[k]y[k]\} \quad (6)$$

where $A_1$ and $A_2$ are the amplitude of each of two alternating signals, ω is the angular frequency, k is one position on the time axis of the sampled data, k+1 is the position one step backward from the position k on the time axis, and k−1 is the position one step forward from the position k on the time axis.

2. The signal processing device according to claim 1, further comprising an amplifying unit amplifying the two alternating signals with a predetermined gain prior to conversion of the two alternating signals by the converting unit.

* * * * *